(12) United States Patent
Fuhrmann et al.

(10) Patent No.: US 11,728,453 B2
(45) Date of Patent: Aug. 15, 2023

(54) STACKED MONOLITHIC MULTIJUNCTION SOLAR CELL

(71) Applicant: AZUR SPACE Solar Power GmbH, Heilbronn (DE)

(72) Inventors: Daniel Fuhrmann, Heilbronn (DE); Rosalinda Van Leest, Made (NL); Gregor Keller, Heilbronn (DE); Matthias Meusel, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 17/373,199

(22) Filed: Jul. 12, 2021

(65) Prior Publication Data
US 2022/0013676 A1    Jan. 13, 2022

(30) Foreign Application Priority Data

Jul. 10, 2020 (DE) ...................... 10 2020 004 170.1

(51) Int. Cl.
| | |
|---|---|
| *H01L 31/0725* | (2012.01) |
| *H01L 31/043* | (2014.01) |
| *H01L 31/0735* | (2012.01) |
| *H01L 31/074* | (2012.01) |

(52) U.S. Cl.
CPC ........ *H01L 31/0725* (2013.01); *H01L 31/043* (2014.12); *H01L 31/074* (2013.01); *H01L 31/0735* (2013.01)

(58) Field of Classification Search
CPC .................. H01L 31/0725; H01L 31/0735
See application file for complete search history.

(56) References Cited

U.S. PATENT DOCUMENTS

| | | |
|---|---|---|
| 8,716,593 B2 | 5/2014 | Meusel et al. |
| 9,252,313 B2 | 2/2016 | Meusel et al. |
| 10,263,134 B1 | 4/2019 | Derkacs et al. |

(Continued)

FOREIGN PATENT DOCUMENTS

EP    2264788 A2    12/2010

OTHER PUBLICATIONS

Hoehn et al : Development of Germanium-Based Wafer-Bonded Four-Junction Solar Cells, IEEE Journal of Photovoltaics, vol. 9 No. 6, Oct. 11, 2019, ISSN: 2156-3381.

(Continued)

*Primary Examiner* — Golam Mowla
(74) *Attorney, Agent, or Firm* — Muncy, Geissler, Olds & Lowe, P.C.

(57) ABSTRACT

A stacked monolithic multijunction solar cell, which includes a first subcell having a p-n junction with an emitter layer and a base layer, the thickness of the emitter layer being less than the thickness of the base layer at least by a factor of ten, and the first subcell comprising a substrate having a semiconductor material from the groups III and V or a substrate from the group IV, and which further includes a second subcell arranged on the first subcell and a third subcell arranged on the second subcell, the two subcells each including an emitter layer and a base layer, and a tunnel diode and a back side field layer each being formed between the subcells, the thickness of the emitter layer being greater than the thickness of the base layer in each case between the second subcell and in the third subcell.

19 Claims, 2 Drawing Sheets

(56) References Cited

U.S. PATENT DOCUMENTS

| | | | |
|---|---|---|---|
| 2010/0193002 A1* | 8/2010 | Dimroth | H01L 31/1808 438/758 |
| 2014/0076388 A1* | 3/2014 | King | H01L 31/0725 136/255 |
| 2014/0076391 A1 | 3/2014 | King et al. | |
| 2014/0261611 A1 | 9/2014 | King et al. | |
| 2017/0170354 A1* | 6/2017 | Ebel | H01L 31/0735 |
| 2020/0203537 A1* | 6/2020 | Derkacs | H01L 31/06875 |

OTHER PUBLICATIONS

Bauhuis et al : "Deep junction III-V solar cells with enhanced performance", Institute for Molecules and Materials, Radboud University, Mar. 11, 2016, DOI: 10.2002/pssa.201532903.

Van Leest et al : "Recent progress of solar cell development for CPV applications at AzurSpace", Sep. 11, 2019, pp. 586-589, ISSN: 0094-243X.

J.F.Geisz et al; "Enhanced external radiative efficiency for 20.8% efficient single-junction GaInP solar cells", Applied Physics Letters, vol. 103, No. 4, Jul. 25, 2013.

\* cited by examiner

STACKED MONOLITHIC MULTIJUNCTION SOLAR CELL

This nonprovisional application claims priority under 35 U.S.C. § 119(a) to German Patent Application No. 10 2020 004 170.1, which was filed in Germany on 10 Jul. 2020, and which is herein incorporated by reference.

BACKGROUND OF THE INVENTION

Field of the Invention

The present invention relates to a stacked monolithic multijunction solar cell.

Description of the Background Art

A stacked monolithic multijunction solar cell is known from EP 2 264 788 A1, which corresponds to US 2008/0163920, which is incorporated herein by reference. Further multijunction solar cells are known from US 2014/0076391 A1, US 2014/0261611 A1 and U.S. Pat. No. 10,263,134 B1. A group IV subcell is known from US 2014/0076391 A1, the emitter having a greater thickness than the base.

Monolithic multijunction solar cells made of III-V semiconductor material demonstrate particularly high efficiencies for terrestrial applications in the field of concentrator systems, with an efficiency of more than 40%. The higher the efficiency and the lower the manufacturing costs, the more competitive are the concentrator systems, compared to conventional silicon solar cell systems.

SUMMARY OF THE INVENTION

It is therefore an object of the present invention to provide a device which refines the prior art.

In an exemplary embodiment, a stacked monolithic multijunction solar cell is provided that includes a first subcell having a p-n junction with an emitter layer and a base layer. The thickness of the emitter layer is less than the thickness of the base layer at least by a factor of five or by a factor of ten.

The first subcell comprises a substrate having a semiconductor material from groups III and V or a substrate from Group IV.

A second subcell is arranged on the first subcell. A third subcell is arranged on the second subcell.

The second subcell and the third subcell each include an emitter layer and a base.

The emitter layer can be n-doped and the base layer can be p-doped.

A tunnel diode and a back side field layer are each formed between the subcells, the thickness of the emitter layer in the second subcell and/or in the third subcell being greater in each case than the thickness of the base or the base layer.

It should be noted that the term, base, also cover the associated base layers, even if, in a portion of the exemplary embodiments which were previously used exclusively as back side field layers, are now also used as the base.

In all cases, these are layers covering the entire surface, which are integrally connected directly to the particular emitter or the particular emitter layer.

It should be noted that the present arrangement may also be transferred to four-junction solar cells or five-junction solar cells. The fourth subcell is preferably arranged beneath the second subcell or above the third subcell or between the second and third subcells.

The fifth subcell can be arranged beneath the second subcell or above the third subcell or between the second and third subcells.

It should furthermore be noted that GaAs or InP, in particular, is preferred as the III-V substrate material. In particular, germanium is preferred as the group IV substrate material. The second subcell and the third subcell comprise III-V semiconductor materials or are made of III-V semiconductor materials.

All subcells arranged on the first subcell preferably each have an n-on-p structure. It should be noted that the base of the second subcell and/or the third subcell is formed from a base layer and/or from the back side field layer.

An advantage of the multijunction solar cell according to the invention is that, in contrast to the previous approach, the efficiency of the multijunction solar cell may be surprisingly substantially increased by the design according to the invention for multijunction solar cells including three or more series-connected subcells in which all emitter layers are substantially thinner than the base.

In particular, it is surprising that the electrons have a higher mobility as minority charge carriers in the base than do the holes as minority charge carriers in the emitter layer and suggest the previous design for multijunction solar cells with a significantly thinner emitter layer compared to the base.

The present multijunction solar cell according to the invention extremely surprisingly may also be used for metamorphic multijunction solar cells and thereby increase the efficiency of metamorphic multijunction solar cells.

Metamorphic multijunction solar cell concepts are based on the implementation of a metamorphic buffer between two consecutive subcells.

A disadvantage of the metamorphic concepts is that the defect density is significantly increased, compared to lattice-matched multijunction solar cells. The minority charge carrier lifespan is reduced hereby, whereby thin emitter layers, in particular, are necessary.

In the present multijunction solar cell according to the invention, to increase the efficiency, the emitter layer of the second and/or third subcell may be surprisingly provided with a significantly thicker design than the particular base or base layer.

It has furthermore been surprisingly shown that an increase in the efficiency also occurs at a higher concentration of sunlight. Due to the thicker emitter layer of the topmost solar subcell, the transverse conduction to the metal fingers is improved, so that series resistance loses are reduced and the efficiency of the solar cell is improved. This is an advantage, in particular, for use in concentrator solar cells.

It is moreover surprising that the absorption may be increased by the present design of a multifunction solar cell. The overall thickness of the multijunction solar cell may be surprisingly decreased hereby without reducing the efficiency of the multifunction solar cell. In addition, the yield is increased and the manufacturing costs are reduced.

It is further surprising that the concept of an emitter layer that is thicker than the associated base layer in subcell T2 and/or subcell T3 may be advantageously combined with the concept of the emitter layer that is thinner than the base layer in subcell T1 in one multijunction solar cell.

The back side field layer in the second subcell and/or in the third subcells can be designed as the base in each case. An advantage is that the overall thickness of the multijunction solar cell and the series resistance of the multijunction solar cell may be reduced hereby.

In the second subcell and/or in the third subcell, the back side field layer and the emitter layer can comprise different semiconductor materials. In another refinement, the back side field layer has a different stoichiometry than the emitter layer.

The thickness of the emitter layer in the second subcell and/or in the third subcell can be greater than the thickness of the base by a factor of three or by a factor of ten or by a factor of 15 of by a factor of 20.

The thickness of the back side field layer can be in a range between 20 nm and 100 nm or in a range between 40 nm and 60 nm, the doping concentration being in a range between $5 \cdot 10^{17}/cm^3$ and $5 \cdot 10^{18}/cm^3$ or in a range between $9 \cdot 10^{17}/cm^3$ and $2.5 \cdot 10^{18}/cm^3$. The band gap energy within the back side field layer preferably changes or is constant. If the band gap energy changes, it is preferred that the change in the band gap energy takes place in a stepped manner or continuously over the course of the thickness of the back side field layer.

A semiconductor mirror can be formed between the first subcell and the second subcell. The semiconductor mirror is preferably formed between the first subcell and the back side field layer of the second subcell.

The emitter layer of the second subcell can comprises an (Al)InGaAs material. The aluminum is optional, i.e. the content of aluminum is equal to zero in one refinement.

The emitter layer of the third subcell can comprises an (Al)InGaP material. The aluminum is optional.

The first subcell can be designed as a Ge subcell and the second subcell as an InGaAs subcell and the third subcell as an InGaP subcell.

The subcells of the multijunction solar cell can be designed to be lattice-matched to each other. In one refinement, the lattice constant between the subcells varies or, in other words, the lattice constant is different at least between two subcells.

A metamorphic buffer can be formed between the first subcell and the second subcell.

The band gap energy of the second subcell can be greater than the band gap energy of the first subcell. The band gap energy of the third subcell can be greater than the band gap energy of the second subcell.

The thickness of the emitter of the first subcell can be in a range between 50 nm and 500 nm or in a range between 80 nm and 250 nm, the doping concentration being in a range between $5 \cdot 10^{17}/cm^3$ and $5 \cdot 10^{19}/cm^3$ or in a range between $9 \cdot 10^{17}/cm^3$ and $5 \cdot 10^{18}/cm^3$. The base can be determined by the thickness of the substrate and is above 50 μm, the doping of the substrate being in a range between $4 \cdot 10^{16}/cm^3$ and $1 \cdot 10^{18}/cm^3$ or in a range between $1 \cdot 10^{17}/cm^3$ and $6 \cdot 10^{17}/cm^3$.

The layer thickness of the emitter of the second subcell can be in a range between 1 μm and 3.8 μm or in a range between 2.2 μm and 3.2 μm, the doping concentration being in a range between $5 \cdot 10^{16}/cm^3$ and $7 \cdot 10^{17}/cm^3$ or in a range between $9 \cdot 10^{16}/cm^3$ and $3 \cdot 10^{17}/cm^3$.

If a base layer is formed between the back side field layer of the second subcell and the emitter of the second subcell, the thickness of the base layer can be in a range between 10 nm and 200 nm or in a range between 40 nm and 80 nm, and the doping is in a range between $5 \cdot 10^{17}/cm^3$ and $5 \cdot 10^{18}/cm^3$ or in a range between $9 \cdot 10^{17}/cm^3$ and $2.8 \cdot 10^{18}/cm^3$.

The layer thickness of the emitter of the third subcell can be in a range between 200 nm and 1500 nm or in a range between 0.7 μm and 1.2 μm, the doping concentration can be in a range between $5 \cdot 10^{16}/cm^3$ and $5 \cdot 10^{17}/cm^3$ or in a range between $9 \cdot 10^{16}/cm^3$ and $3 \cdot 10^{17}/cm^3$.

If a base layer is formed between the back side field layer of the third subcell and the emitter of the third subcell, the thickness of the base layer can be in a range between 10 nm and 120 nm or in a range between 40 nm and 80 nm, and the doping is in a range between $5 \cdot 10^{17}/cm^3$ and $5 \cdot 10^{18}/cm^3$ or in a range between $9 \cdot 10^{17}/cm^3$ and $2.8 \cdot 10^{18}/cm^3$.

The emitter can have a lower doping than the base in the second subcell and/or in the third subcell. In contrast thereto, the emitter can have a higher doping than the base in the first subcell and the fifth subcell and in the fourth subcell.

The emitter of all subcells of the multijunction solar cell can be n-doped and the base of all subcells can be p-doped.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
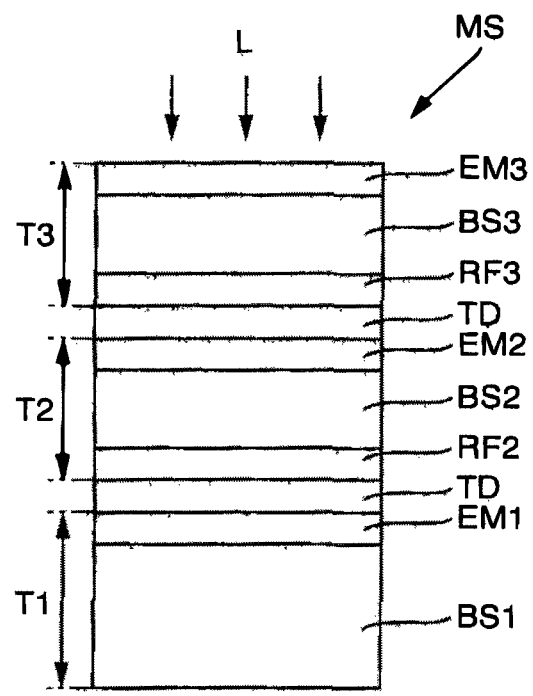
FIG. 1 shows a cross-section of an example of a multijunction solar cell including three subcells.

The illustration in FIG. 1 shows a cross-sectional view of an example of a stacked monolithic three-junction solar cell MS, which includes a first subcell T1 and a second subcell T2 and a third subcell T3. Upon an irradiation with light L, the latter always first strikes the emitter of the topmost subcell.

A tunnel diode TD is formed in each case between individual subcells T1, T2 and T3.

It is understood that, for reasons of clarity, metal or connecting contact layers, in particular, as well as window layers and antireflection layers are not shown. It should also be noted that the emitter is n-doped and the base is p-doped.

In the present case, the three subcells T1, T2 and T3 are designed to be lattice-matched to each other.

It should be noted that, in an example which is not illustrated, a fourth subcell and/or a fifth subcell are optionally formed above first subcell T1.

First subcell T1 includes an n-doped emitter layer EM1 and a p-doped base layer BS1, the thickness of emitter layer EM1 being less than the thickness of base layer BS1 at least by a factor of ten.

First subcell T1 may also be referred to as a substrate cell and, in the present case, comprises Ge as the semiconductor material. It is understood that GaAs or InP, in particular, may also be used instead of Ge as the substrate material.

A second subcell T2 is arranged on first subcell T1. Second subcell T2 has a larger band gap than first subcell T1. A third subcell T3 is arranged on second subcell T2. Third subcell T3 has a larger band gap than second subcell T2.

A tunnel diode TD is arranged in each case between first subcell T1 and second subcell T2 and between second subcell T2 and third subcell T3.

Second subcell T2 includes a back side field layer RF2 arranged above tunnel diode TD and an optional base layer BS2 arranged above back side field layer RF2 and an emitter layer EM2 arranged above the base layer BS2, emitter layer EM2 being thicker than optional base layer BS2 and/or back side field layer RF2 at least by a factor of 10.

Third subcell T3 includes a back side field layer RF3 arranged above tunnel diode TD and an optional base layer BS3 arranged above back side field layer RF3 and an emitter layer EM3 arranged above the base layer BS3, emitter layer EM3 being thicker than optional base layer BS3 and/or back side field layer RF3 at least by a factor of 10.

Figure 2:
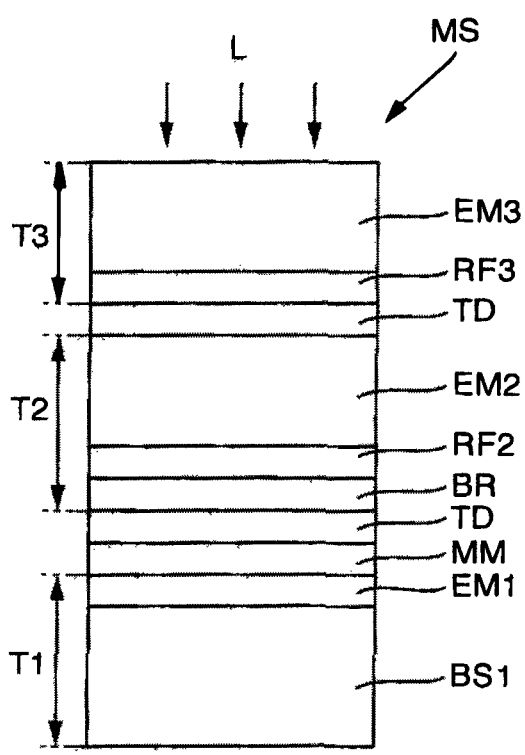
FIG. 2 shows a cross-section of a further example of a multijunction solar cell including three subcells.

The illustration in FIG. 2 shows a cross-sectional view of a further example of a stacked monolithic three-junction solar cell MS. Only the differences from the example shown in FIG. 1 are explained below.

A metamorphic buffer MM and a semiconductor mirror BR are arranged between first subcell T1 and second subcell T2.

In an example, which is not illustrated, either only metamorphic buffer MM or only semiconductor mirror BR are formed.

Base layers BS2 and BS3 are not formed in the case of second subcell T2 and third subcell T3. Back side field layers RF2 and RF3 each thereby form the bases of the two subcells T2 and T3. Back side field layers RF2 and RF3 preferably each have a different stoichiometry or a different semiconductor material than emitter layers EM2 and EM3 formed in each case directly on back side field layers RF2 and RF3.

Subcells of this type are also referred to as heterocells.

Figure 3:
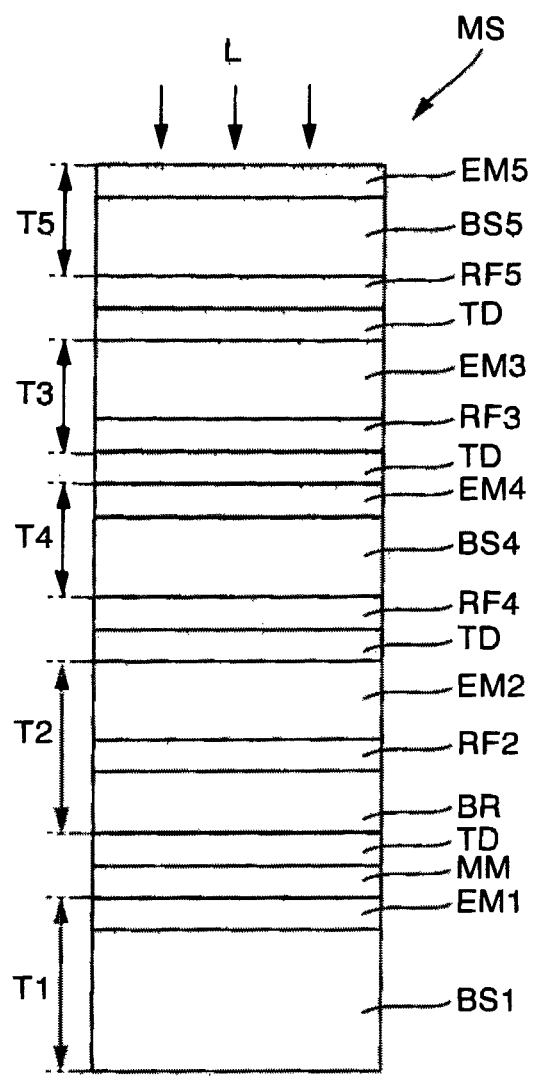
FIG. 3 shows a cross-section of a further example of a multijunction solar cell including five subcells.

The illustration in FIG. 3 shows a cross-sectional view of a further example of a stacked monolithic five-junction solar cell MS. Only the differences from the example shown in FIG. 2 are explained below.

A fourth subcell T4, which includes an emitter with an emitter layer EM4 and a base with a base layer BS4, is arranged between second subcell T2 and third subcell T3. A back side field layer RF4 is formed between base layer BS4 and second subcell T2. A tunnel diode TD is formed between back side field layer RF4 and second subcell T2. The thickness of base layer BS4 is greater than the thickness of emitter layer EM4 in keeping with the present prior art.

A fifth subcell T5, which includes an emitter with an emitter layer EM5 and a base with a base layer BS5, is arranged on third subcell T3. A back side field layer RF5 is formed between base layer BS5 and third subcell T3. A tunnel diode TD is formed between back side field layer RF5 and third subcell T3. The thickness of base layer BS5 is greater than the thickness of emitter layer EM5 in keeping with the present prior art.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked monolithic multifunction solar cell comprising:
   a first subcell that has a p-n junction with a first emitter layer and a first base layer, a thickness of the first emitter layer being less than a thickness of the first base layer at least by a factor of five, and the first subcell comprising a substrate having a semiconductor material from the groups III and V or the substrate from the group IV;
   a second subcell arranged on the first subcell, the second subcell including a second emitter layer and a second base;
   a third subcell arranged on the second subcell, the third subcell including a third emitter layer and a third base;
   a first tunnel diode and a first back side field layer formed between the first and second subcells and a second tunnel diode and a second back side field layer formed between the second and third subcells,
   wherein the second subcell and the third subcell comprise III-V semiconductor materials;
   wherein a thickness of the second emitter layer is greater than a thickness of the second base in the second subcell, and
   wherein a thickness of the third emitter layer is greater than a thickness of the third base in the third subcell.

2. The stacked monolithic multijunction solar cell according to claim 1, wherein the first back side field layer is designed as the second base in the second subcell and/or the second back side field layer is designed as the third base in the third subcell.

3. The stacked monolithic multijunction solar cell according to claim 1,
   wherein, in the second subcell, the first back side field layer comprises a different semiconductor material with respect to the second emitter layer of the second subcell, or the first back side field layer has a different stoichiometry than the second emitter layer of the second subcell, and the first back side field layer has a higher band gap than the second emitter layer of the second subcell, and/or
   wherein, in the third subcell, the second back side field layer comprises a different semiconductor material with respect to the third emitter layer of the third subcell, or the second back side field layer has a different stoichiometry than the third emitter layer of the third subcell, and the second back side field layer has a higher band gap than the third emitter layer of the third subcell.

4. The stacked monolithic multijunction solar cell according to claim 1,
   wherein, in the second subcell, the thickness of the second emitter layer is greater than the thickness of the second base and/or a thickness of the first back side field layer by a factor between five and ten, and
   wherein, in the third subcell, the thickness of the third emitter layer is greater than the thickness of the third base and/or a thickness of the second back side field layer by a factor between five and ten.

5. The stacked monolithic multijunction solar cell according to claim 1,
   wherein a thickness of the first back side field layer is in a range between 20 nm and 100 nm, and a band gap energy changes within the first back side field layer, and/or
   wherein a thickness of the second back side field layer is in a range between 20 nm and 100 nm, and a band gap energy changes within the second back side field layer.

6. The stacked monolithic multijunction solar cell according to claim 1, further comprising:
   a semiconductor mirror formed between the first subcell and the second subcell.

7. The stacked monolithic multijunction solar cell according to claim 1, wherein the second emitter layer of the second subcell comprises an (Al)InGaAs material.

8. The stacked monolithic multijunction solar cell according to claim 1, wherein the third emitter layer of the third subcell comprises an (Al)InGaP material.

9. The stacked monolithic multijunction solar cell according to claim 1, wherein the first, second, and third subcells are lattice-matched to each other.

10. The stacked monolithic multijunction solar cell according to claim 1, further comprising:
a metamorphic buffer formed between the first subcell and the second subcell.

11. The stacked monolithic multijunction solar cell according to claim 1,
wherein a band gap energy of the second subcell is greater than a band gap energy of the first subcell, and
wherein a band gap energy of the third subcell is greater than the band gap energy of the second subcell.

12. The stacked monolithic multijunction solar cell according to claim 1, further comprising:
a fourth subcell arranged beneath the second subcell or above the third subcell or between the second subcell and the third subcell.

13. The stacked monolithic multijunction solar cell according to claim 12, further comprising:
a fifth subcell (T5) arranged beneath the second subcell or above the third subcell or between the fourth subcell and the third subcell.

14. The stacked monolithic multijunction solar cell according to claim 1,
wherein the second emitter layer has a lower doping than a second base layer of the second base in the second subcell, and
wherein the third emitter layer has a lower doping than a third base layer (BS3) of the third base in the third subcell.

15. The stacked monolithic multijunction solar cell according to claim 1,
wherein a thickness of the first back side field layer is in a range between 20 nm and 100 nm, and a band gap energy is constant within the first back side field layer, and/or
wherein a thickness of the second back side field layer is in a range between 20 nm and 100 nm, and a band gap energy is constant within the second back side field layer.

16. The stacked monolithic multijunction solar cell according to claim 1, wherein lattice constants are different between at least two of the first, second, and third subcells.

17. The stacked monolithic multijunction solar cell according to claim 1, wherein the first subcell is arranged such that light entering the monolithic multijunction solar cell
strikes the first emitter layer before striking the first base layer,
strikes the second emitter layer before striking the second base, and
strikes the third emitter layer before striking the third base.

18. The stacked monolithic multijunction solar cell according to claim 12, wherein the fourth subcell comprises a fourth emitter on a fourth base, a thickness of the fourth base being greater than a thickness of the fourth emitter.

19. The stacked monolithic multijunction solar cell according to claim 13, wherein the fifth subcell comprises a fifth emitter on a fifth base, a thickness of the fifth base being greater than a thickness of the fifth emitter.

* * * * *